United States Patent [19]
Elwood et al.

[11] Patent Number: 5,217,154
[45] Date of Patent: Jun. 8, 1993

[54] SEMICONDUCTOR BONDING TOOL

[75] Inventors: Richard Elwood, Petaluma; Kenneth Ellett, San Rafael; Hugo Stebler, Petaluma, all of Calif.

[73] Assignee: Small Precision Tools, Inc., Petaluma, Calif.

[21] Appl. No.: 526,674

[22] Filed: May 22, 1990

Related U.S. Application Data

[63] Continuation of Ser. No. 365,920, Jun. 13, 1989, abandoned.

[51] Int. Cl.$^5$ .................................................. B23K 3/00
[52] U.S. Cl. ................................... 228/4.5; 228/44.7
[58] Field of Search .................... 228/4.5, 44.7, 1.1, 228/110, 179, 243, 904

[56] References Cited

U.S. PATENT DOCUMENTS

| | | | |
|---|---|---|---|
| 3,627,192 | 12/1971 | Killingsworth | 228/4.5 |
| 4,629,373 | 12/1986 | Hall | 76/DIG. 12 |
| 4,667,867 | 5/1987 | Dobbs et al. | 228/44.7 |
| 4,767,050 | 8/1988 | Flood et al. | 228/222 |
| 4,890,782 | 1/1990 | Nakai et al. | 228/222 |

FOREIGN PATENT DOCUMENTS

| | | | |
|---|---|---|---|
| 0185537 | 6/1986 | European Pat. Off. | 228/122 |
| 0230233 | 7/1987 | European Pat. Off. | 228/122 |
| 8901384 | 2/1989 | European Pat. Off. | 228/1.1 |
| 30221 | 9/1973 | Japan | 228/44.7 |
| 158335 | 7/1987 | Japan | 228/4.5 |
| 73532 | 4/1988 | Japan | 228/4.5 |
| 719834 | 3/1980 | U.S.S.R. | 228/4.5 |
| 1311888 | 5/1987 | U.S.S.R. | 228/1.1 |

OTHER PUBLICATIONS

IEEE Transactions on Components, Hybrids, and Manufacturing Technology, vol. CHMT-2, No. 3, pp. 283-288, Sep. 1979.

Western Electric, "Multidirectional Ultrasonic Wire Bonding Tip", Avedissian, Technical Digest No. 20, p. 78, Oct. 1970.

*Primary Examiner*—Samuel M. Heinrich

[57] ABSTRACT

The disclosure relates to a bonding tool tip bonding electronic interconnects having a shank portion formed of a relatively hard, stiff material having a high modulus of elasticity and a foot portion formed of polycrystalline diamond bonded to the shank portion. The shank portion is preferably formed of tungsten carbide. The foot portion can have an aperture therethrough for feeding of wire to be welded.

12 Claims, 1 Drawing Sheet

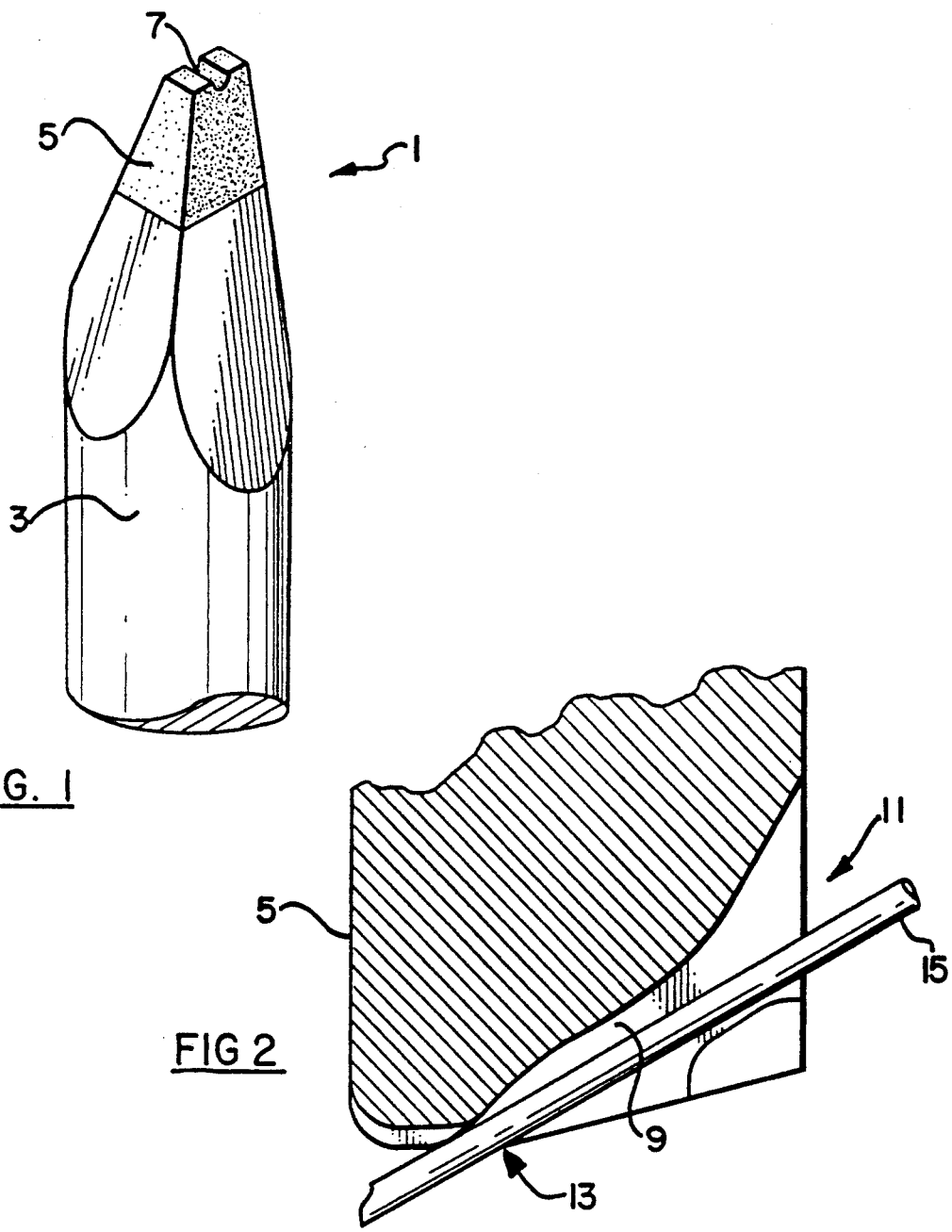

SEMICONDUCTOR BONDING TOOL

This application is a continuation of application Ser. No. 07/365,920, filed Jun. 13, 1989, now abandoned.

BACKGROUND OF THE INVENTION

1. Field of the Invention

This invention relates to semiconductor bonding tools for microwelding electronic interconnects, primarily in the microelectronics field and, more specifically to the bonding of wires and leads to conductor surfaces, such as bonding pads of semiconductor devices and associated structures.

2. Brief Description of the Prior Art

In the field of semiconductor technology, it is often necessary to interconnect electrically conductive areas. A common such interconnect involves connections between the bond pads of a semiconductor chip and the leads extending from the interior to the exterior of the package housing the semiconductor chip. Such interconnections are generally provided by bonding thin wires, tapes, film conductors and the like, generally of gold, aluminum, copper or various metal alloys. In the case of wires, such wires are generally of the order of one mil (0.001 inch) and are bonded or microwelded between the two points to be interconnected. Such bonding takes place in conjunction with well known wire bonding equipment.

The wire bonding equipment for providing the microwelds described above generally utilizes thermosonic, thermocompression or ultrasonic welding techniques.

Thermosonic bonding methods require bringing the wire, ribbon or TAB film into engagement with the conductive surface to which it to be welded and using a tool tip to force the surfaces to be welded (i.e., wire and bond pad) into close proximity in the contact area. Simultaneous heat, pressure and ultrasonic energy are applied to the metal surfaces beneath the tool tip to penetrate surface oxide layers and cause the molecules of the metals to interdiffuse to form the microweld or bond.

Thermocompression bonding is similar to thermosonic bonding except that the microweld or bond is formed using only heat and pressure. Ultrasonic bonding is also similar to thermosonic bonding except that the weld is formed by applying only ultrasonic energy. In each case, the tool tip is utilized.

Prior art bond tool tips have been provided utilizing many different materials and with many different geometries. For example, such prior art tool tips have included a circular, V-shaped, square or rectangular, etc. bond foot which is concave, convex, flat or comprised of a series of parallel or non-parallel grooves or raised surfaces to promote bonding or microwelding at conductor interconnect points. Prior art bonding tools have been formed of tungsten carbide, titanium carbide, steel alloys, tungsten carbide with an osmium tipped bonding foot and tungsten carbide with a ceramic tip bonding foot. The bonding tip or foot experiences a great deal of heat, abrasion and stress during the bond cycle. This promotes a variety of problems including material buildup or load up on the bonding foot, tip abrasion wear and degradation of tip or bonding foot geometries causing lost productivity, low quality bond formation and frequent tool changes.

The carbide material tools are a cemented matrix that consists of 6 to 10% binder. The metals used in the wires or TAB films adhere to this binder system and quickly load up. This will not only plug feed holes, thereby necessitating tool change, but, in addition, load up in the front radius or back radius leads to heel cracks. These heel cracks are a well documented cause for semiconductor device failure. The osmium tip tools, steel alloys and ceramic tip tools do not contain binder systems, but still have an affinity for the metals used in bonding and will also load up.

Furthermore, the current materials used for bond wedges, due to the binder and material characteristics thereof, will wear or abrade. The binder breaks out and the osmium and ceramic wear away. This necessitates frequent tool changes and subsequent lost productivity due to machine downtime. Since the face of the tools is abrading, the shape of the tool degrades over its lifetime. This alters the bond foot geometry in intimate contact with the wire or film and conductor surface and will cause inconsistent bond quality.

The abrasion and tool wear also changes the surface texture of standard tools during its bond life. This change in surface texture will affect how efficiently the ultrasonic energy is coupled to the bond wire, ribbon or film. Since the ultrasonic energy is fixed for a process, an increase in tool slippage due to surface changes will lead to inconsistent bond quality during the life of the tool. The increased hardness that the copper films, which are generally used in TAB bonding, exhibit causes current tools to be very susceptible to this phenomenon.

SUMMARY OF THE INVENTION

In accordance with the present invention, the above noted problems of prior art tools and tool tips for formation of interconnects are minimized and there is provided a tool and tool tip which displays increased life, more consistent bond quality due to less degradation of tool geometry, increased productivity, improved ultrasonic energy coupling during the bonding process, increased life expectancy and lower per bond tool cost.

Briefly, in accordance with the present invention, there is provided a tool tip which is composed of a shank of relatively hard, stiff material, such as, for example and preferably, tungsten carbide, to efficiently transfer ultrasonic energy and a bond tip or foot of a extremely hard polycrystalline diamond material (PCD) that is electro discharge machining (EDM) machinable and will not wear or abrade and which has reduced material buildup or load up during the microwelding process. The polycrystalline diamond material bond tip provides extremely desirable properties for the use intended herein. The shank is secured to the bond tip or foot by high temperature, high pressure sintering of the diamond directly to the tungsten carbide, by simple brazing or the like.

The bonding tool can contain wire feed holes for feeding wire to be welded as well as slots, oval holes or no holes for use in forming and positioning the microweld. Tip and slot geometries will vary depending upon the bond application.

Though the preferred material for use as the shank portion of the bond tip is tungsten carbide, it should be understood that other material having the above noted properties can also be used. These materials include, but are not limited to, tool steel alloys and titanium carbide.

BRIEF DESCRIPTION OF THE DRAWINGS

FIG. 1 is a perspective view of a bonding tool tip in accordance with the present invention; and FIG. 2 is a perspective view of a bond tip or foot in accordance with the present invention showing an aperture therein for feeding of wire to the bond tip for welding.

DESCRIPTION OF THE PREFERRED EMBODIMENT

Referring first to FIG. 1, there is shown a bonding tool tip 1 having a tungsten carbide shank portion 3 and a diamond bond tip or foot portion 5. The bond tip portion can include a groove 7 therein for retaining a wire or the like to be welded therein. While the groove 7 is shown as semicircular, it is readily apparent that it can take any desired shape. Typical other such shapes are rectangular including square, inverted "V", etc. The shank 3 is secured to the tip or foot portion 5 by high pressure, high temperature sintering in accordance with known techniques.

In addition, cross grooves can be added as singular or multiple configurations, with or without intersection at any desired angle in the case of multiple grooves. In the multiple groove configuration, one of the grooves can have a tapered or closed end for terminating the bonded wire on the final electronic interconnect.

In certain bonding situations, to aid in ultrasonic energy coupling, the bond foot is provided with protrusions in the form of cross protrusions, multiple cross protrusions, intersecting protrusions, intersecting protrusions at various angles to the wire feed and the like. In addition, the bond tip portion can have a cross section of any desired shape, such as rectangular, circular or any other desired geometrical shape.

In order to feed wire to be bonded to the bonding foot, an aperture is provided in the bonding tip which can extend through the tip portion only or through both the tip and shank portions. An embodiment of the latter is shown in FIG. 2 wherein there is shown a tip or foot portion 5 having an aperture 9 extending between adjacent faces of the tip or foot portion. Wire or ribbon 15 is fed into aperture opening 11 and passes through the aperture 9 to the aperture outlet 13 which is disposed at the wire bonding location. The aperture 9 can be of various shapes, such as, for example, round, rectangular, slotted, etc.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A bonding tool tip for bonding electronic interconnects to the pads of semiconductor devices, comprising:
    (a) a shank portion formed of a relatively hard, stiff material having a high modulus of elasticity; and
    (b) a polycrystalline diamond tapered foot portion bonded to said shank portion.

2. A bonding tool tip as set forth in claim 1 wherein said shank portion is formed of a material taken from the class consisting of tungsten carbide, titanium carbide and tool steel alloys.

3. A bonding tool as set forth in claim 1, further including an aperture, both ends of said aperture extending to external surfaces of said foot portion for feeding of wire therethrough.

4. A bonding tool as set forth in claim 2, further including an aperture, both ends of said aperture extending to external surfaces of said foot portion for feeding of wire therethrough.

5. A bonding tool as set forth in claim 1 wherein said foot portion includes at least one groove therein.

6. A bonding tool as set forth in claim 2 wherein said foot portion includes at least one groove therein.

7. A bonding tool as set forth in claim 3 wherein said foot portion includes at least one groove therein.

8. A bonding tool as set forth in claim 4 wherein said foot portion includes at least one groove therein.

9. A bonding tool as set forth in claim 1 wherein said foot portion includes at least one protrusion thereon.

10. A bonding tool as set forth in claim 2 wherein said foot portion includes at least one protrusion thereon.

11. A bonding tool as set forth in claim 3 wherein said foot portion includes at least one protrusion thereon.

12. A bonding tool as set forth in claim 4 wherein said foot portion includes at least one protrusion thereon.

* * * * *